United States Patent [19]
Benzoni

[11] Patent Number: 5,619,068
[45] Date of Patent: Apr. 8, 1997

[54] EXTERNALLY BONDABLE OVERMOLDED PACKAGE ARRANGEMENTS

[75] Inventor: Albert M. Benzoni, Lower Macungie Township, Lehigh County, Pa.

[73] Assignee: Lucent Technologies Inc., Murray Hill, N.J.

[21] Appl. No.: 430,665

[22] Filed: Apr. 28, 1995

[51] Int. Cl.$^6$ .............................. H01L 23/48; H01L 23/52
[52] U.S. Cl. ........................ 257/690; 257/680; 257/762; 257/766
[58] Field of Search ............................. 257/666, 667, 257/668, 680, 681, 690, 734, 904, 924, 762, 766

[56] References Cited

U.S. PATENT DOCUMENTS

| | | | |
|---|---|---|---|
| 4,000,842 | 1/1977 | Burns | 228/180 A |
| 4,911,519 | 3/1990 | Burton et al. | 350/96.2 |
| 5,294,829 | 3/1994 | Hundt | 257/924 |
| 5,328,552 | 7/1994 | Benzoni | 156/630 |

Primary Examiner—Carl Whitehead, Jr.

[57] ABSTRACT

In a conventional overmolded leadframe package, having a multiplicity of leadframe fingers and encasing one or more electronic devices, a window is formed. The window exposes at least three selected ones of the leadframe fingers at localized sites. At these (exposed) sites of these selected ones of the leadframe fingers, these fingers are coated with a contact material such as gold, whereby localized contact sites are formed. Electrical conductors emanating from one or more external devices—such as electronic devices, electro-optic devices, or opto-electronic devices—can then be bonded to these localized contact sites. The remaining (non-selected) leadframe fingers are typically bonded to a wiring board.

19 Claims, 3 Drawing Sheets

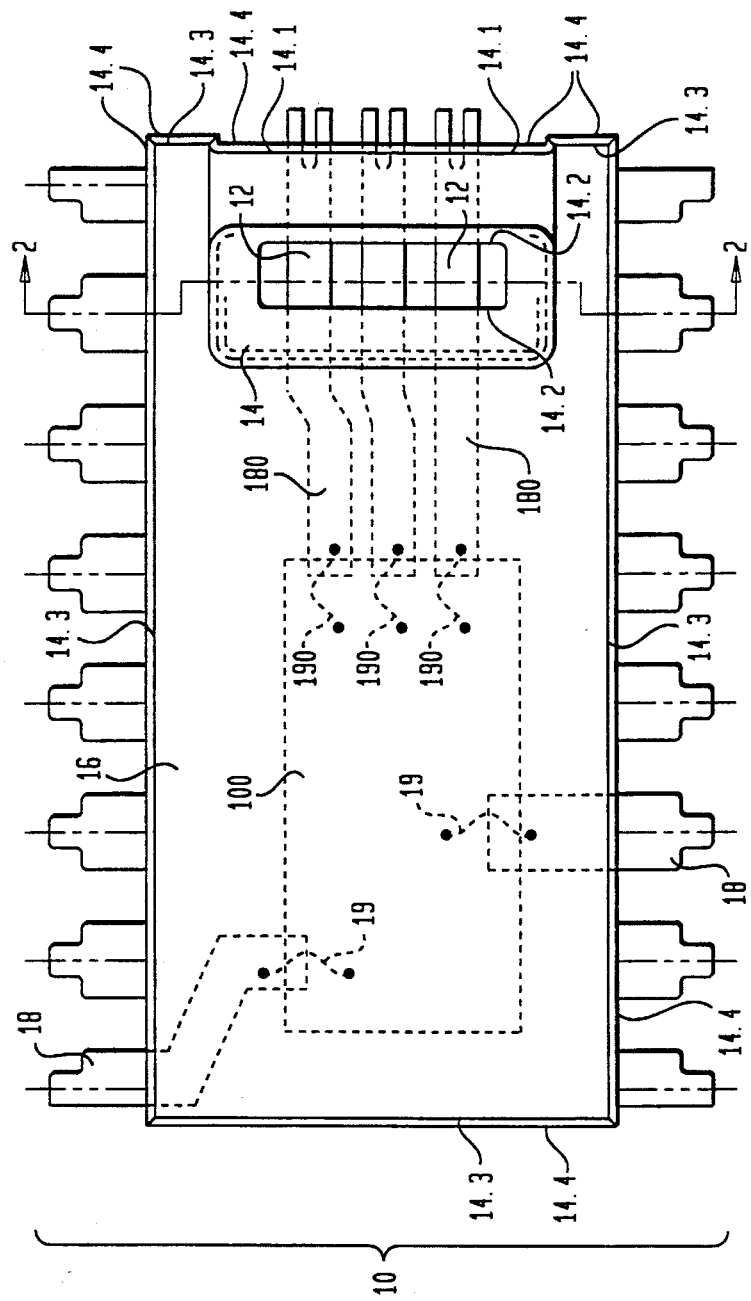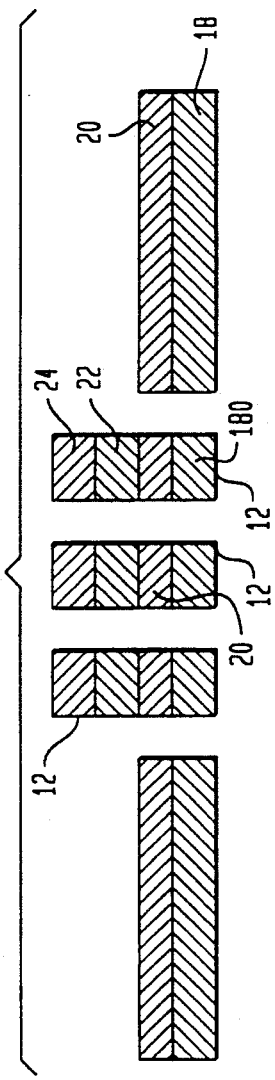

EXTERNALLY BONDABLE OVERMOLDED PACKAGE ARRANGEMENTS

TECHNICAL FIELD

The present invention related to a leadframe structure and, more particularly, to a leadframe structure useful in molded packaging arrangements.

BACKGROUND OF THE INVENTION

In many current electronic and/or optoelectronic and/or electro-optic circuit arrangements, one or more semiconductor components ("semiconductor electronic devices")—such as semiconductor integrated circuit devices—are positioned on a leadframe structure. The leadframe structure, together with the one or more semiconductor electronic devices, is encased in an overmolded package, so as to form a single in-line package (SIP) or dual-in-line package (DIP) structure. The overmolded package typically is molded from a plastic to completely encase the one or more semiconductor electronic devices. Typically, electrical signals are transmitted to or from (or both to and from) the one or more semiconductor electronic devices located in the overmolded package via a supporting printed circuit board ("wiring board") and via a plurality of internal leadframe fingers that are electrically connected to the encased one or more semiconductor electronic devices by means of internal wirebonds—i.e., wirebonds that are themselves encased in the overmolded package. The circuit board has its own wiring located on an insulating board that physically supports the SIP or DIP structure. However, in some cases, an additional requirement arises, to provide a direct electrical contact between the one or more devices located internally to (inside of) the molded package and another device—such as an electronic device, an opto-electronic, an electro-optic, or a combination of them—located eternally to (outside of) the overmolded package, without passing through the wiring of the supporting circuit board (e.g., in situations where the amount of signal degradation, associated with signals passing through the circuit board wiring, would be unacceptable).

A problem associated with a direct wirebond between a device located externally to the package and a device located internally to the package is that an essentially clean wirebond contact on the overmolded package is required to provide both the necessary low-resistance electrical connection and the necessary mechanical integrity. However, inherent in the overmolding operation is a residue of molding compound (typically, a thermoset resin) that will adhere to the exposed wirebond surface. Conventional cleaning agents, which may be capable of removing the resin from the exposed gold wirebond pad sites, are not acceptable alternatives since they have been found to attack the overmolded package or the gold wirebond contact area (or both the package and the contact area), as well as require a one-at-a-time cleaning process (which is costly as compared to a "batch" cleaning system).

A need remains, therefore, for an arrangement capable of improving the electrical quality of wirebond or other electrically conductive wiring attachments to electronic devices located in molded packaging arrangements.

SUMMARY OF THE INVENTION

The need remaining in the prior art that is addressed by the present invention relates to a leadframe structure and, more particularly, to an externally bondable (such as externally wirebondable) leadframe structure useful in molded packaging arrangements.

In accordance with an exemplary embodiment of the present invention, a conventional copper leadframe (prior to the molding operation) is (optionally) blanket plated with nickel, then selectively plated (at externally wirebondable locations) or blanket plated with gold. The gold-plated externally wirebondable areas are subsequently plated with a protective material (for example, copper). The structure is then overmolded, except for a localized window encompassing the externally wirebondable areas, using any desired molding process. Often, however, the overmolding process results in a portion of the molding resin bleeding over into the wirebond sites. After the overmolding process, the structure is therefore exposed to an etchant that is selective between nickel and the protective material such that only the protective layer (and resin coating) is removed. Therefore, the underlying leadframe and the virgin gold contact layer located at the externally wirebondable areas of the external wirebondable sites are exposed.

Illustratively, one or more electronic devices, such as semiconductor integrated circuit devices, are encased in the overmolded package, and one or more other devices' such as electronic, opto-electronic, or electro-optic—are located outside the overmolded package and are electrically connected to the externally wirebondable sites.

In one externally bondable overmolded leadframe structure of the present invention, copper may be used as the protective material, in which case an etchant comprising approximately 10% ammonium hydroxide and 10% HCl may be used to remove the copper.

It is an advantage of the present invention that various combinations of protective materials and etchants may be used to provide for the protection of the wirebond contact.

Other and further advantages of the present invention will become apparent during the course of the following discussion and by reference to the accompanying drawings.

BRIEF DESCRIPTION OF THE DRAWINGS

Referring now to the drawings, where the numerals represent like parts in several views:

FIG. 1 is an exemplary top view of an overmolded dual in-line package (DIP) device, illustrating in particular the localized external wirebondable locations ("sites") to be protected during the molding process;

FIG. 2 is a cross-section of the leadframe portion (molding material omitted) of FIG. 1 indicated by the broken line 2—2 therein;

Figure 3:
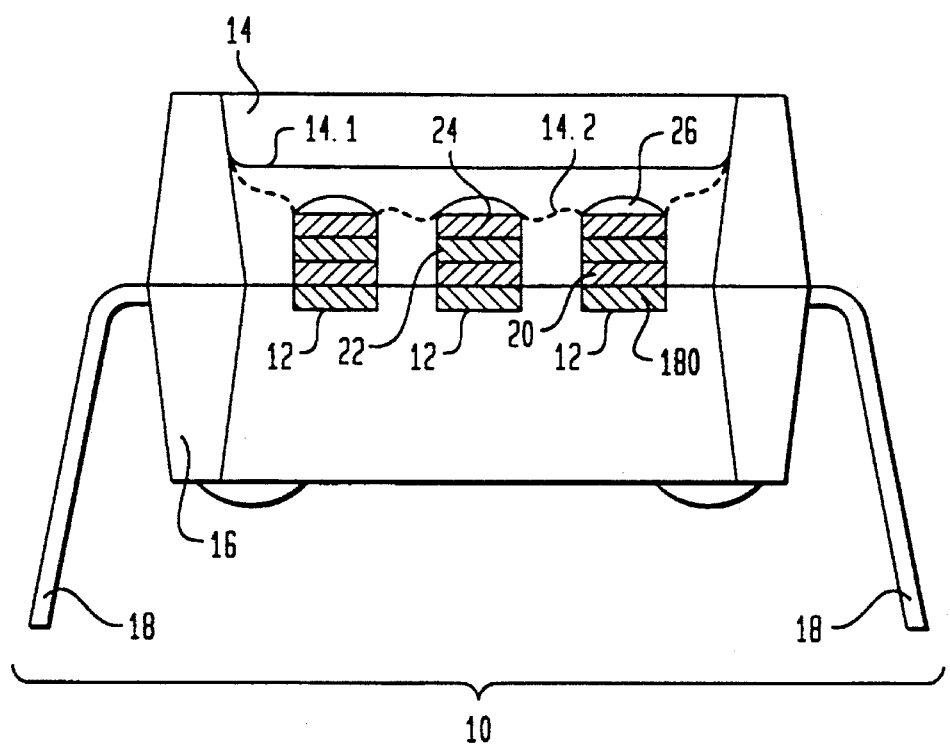
FIG. 3 illustrates an exemplary plated overmolded DIP in accordance with a specific embodiment of the present invention.

Only for the sake of clarity, none of the drawings is to any scale.

DETAILED DESCRIPTION

FIG. 1 illustrates an exemplary externally wirebondable overmolded package 10 that contains an electronic device 100, such as a semiconductor integrated circuit device. The electronic device 100 has leadframe fingers 18 attached to it by means of internal wirebonds 19, for electrical access to the device 100, as known in the art. As used herein, the term "internal" denotes inside the overmolded package 10. As shown, a localized window 14 is formed in a molding material 16 or the overmolded package 10.

The localized window 14 has a bottom surface bounded by edges 14.2. The overmolded package 10 everywhere has top edges 14.3 which lie in a plane except at an indicated portion 14.1 where the package 1 is thinner than elsewhere, i.e., where the height of the package is smaller (the bottom edges 14.4 of the package 10 all lying in a plane).

A few (typically three or more) leadframe fingers 180 extend across the localized window 14 located in the molding material 16 of the overmolded package 10. At this window 14, localized sites 12 of these leadframe fingers 180 are exposed where each of them is coated with a suitable contact layer 22 (FIG. 2) such as gold. Thus the localized sites 12 are the respective localized externally wirebondable portions of those leadframe fingers 180 whose top surfaces are exposed by virtue of the localized window 14.

The leadframe fingers 180 are connected to the device 100 by means of conventional internal wirebonds 190. The localized sites 12 of the leadframe fingers 180 constitute eternally wirebondable locations—i.e., localized areas at which wirebonds (or other electrical conductors or wiring), that are situated externally to (i.e., outside of) the molding material 16 of the overmolded package 10, can be attached (for example, external wirebonds 52 shown in FIG. 5).

The molding material 16 of the overmolded package 10 comprises any suitable molding compound commonly used for molding operations, for example, a commercially available epoxy molding compound, such as cresol-novolacs. As mentioned above, the molding process may result in a certain amount of the molding material, referred to as resin, "bleeding" onto the externally wirebondable locations 12. Obviously, the coating of resin over these wirebondable sites will adversely affect the integrity of any subsequent wirebond (or other bonding) attachment. Therefore, as will be described below, the present invention relates to utilizing a leadframe structure wherein the exposed eternally wirebondable sites 12 are covered with a protective (i.e., sacrificial) layer 24 (FIG. 2) prior to the molding process. The protective layer is then removed after the molding process, taking with it the resin coating. The underlying contact metal (e.g., gold) located at each of the eternally wirebondable sites 12 is then exposed and may be used to provide robust mechanical and electrical contacts.

Leadframe fingers 18 and 180 may comprise any suitable material as known in the art. In many conventional embodiments, a copper alloy leadframe is used. Hence the leadframe fingers 18 and 180 are typically also a copper alloy. In the conventional processing of a leadframe, the copper alloy leadframe may optionally be blanket plated with a nickel layer 20. An intermediate layer of metallization (not shown) for example, silver, may also be included at this location of the structure. In accordance with the structure of the present invention, the portions of the leadframe fingers 180 that are located at the localized sites denoted 12 (FIG. 2) are further plated with the material of the contact layer 22 to be used to form the bond pads for the external wirebond contacts. For example, gold may be used to form plated contact layer 22.

As shown in FIG. 2, a protective layer 24 is formed so as to cover the contact layer 22. Protective layer 24 must comprise a material which may later be removed by an etch process, using an etchant which will not affect either the rest of the nickel-plated copper leadframe fingers 180 underlying the contact layer 22 or the molding compound. In one embodiment, copper may be used to form protective plating layer 24.

A cut-away side view of the eternally wirebondable overmolded package 10, including plated leadframe fingers 180 is illustrated in FIG. 3. As also shown, a pair of leadframe fingers 18 exit from the molding material 16 of the overmolded package 10. As further shown, a residue layer 26 of the molding material (resin) is coated with the protective plating layer 24. In accordance with the teaching of the present invention, residue layer 26 is then removed by using an etchant which will preferentially etch the protective layer 24 with respect to the remaining leadframe material and the molding compounds. For example, when copper is used to form protective layer 24, an etchant comprising 10% ammonium hydroxide and 10% HCl can be used.

Figure 4:
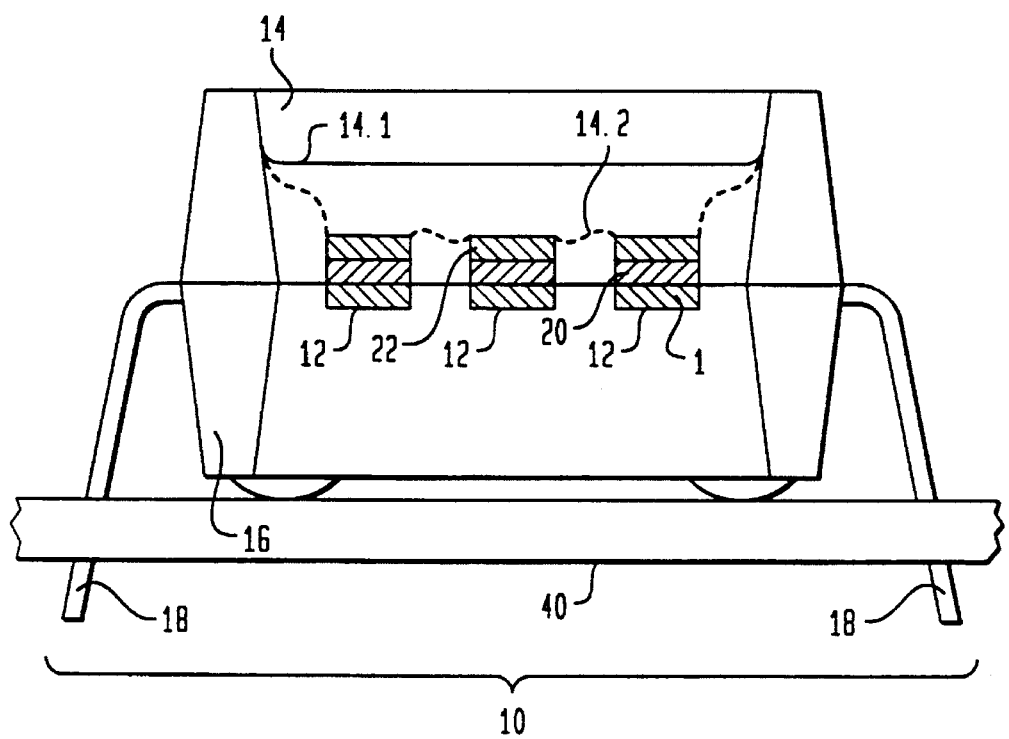
FIG. 4 is a cross-section view of an arrangement including an overmolded DIP device, subsequent to the removal of the protective material, attached to a wiring board, in accordance with another specific embodiment of the invention.

FIG. 4 contains a cut-away side view of the exemplary overmolded package 10 after the removal of both the residue layer 26 and the protective layer 24 by means of the etchant and after assembly with a wiring board 40. The bottom surface of the package 10 is separated from the top surface of wiring board 40 by separators 41. As shown, the removal of these layers 24 and 26 allows for the contact layer 22 (typically gold) to be exposed and available for wirebond attachments such as the external wirebonds 52 (FIG. 5).

Figure 5:
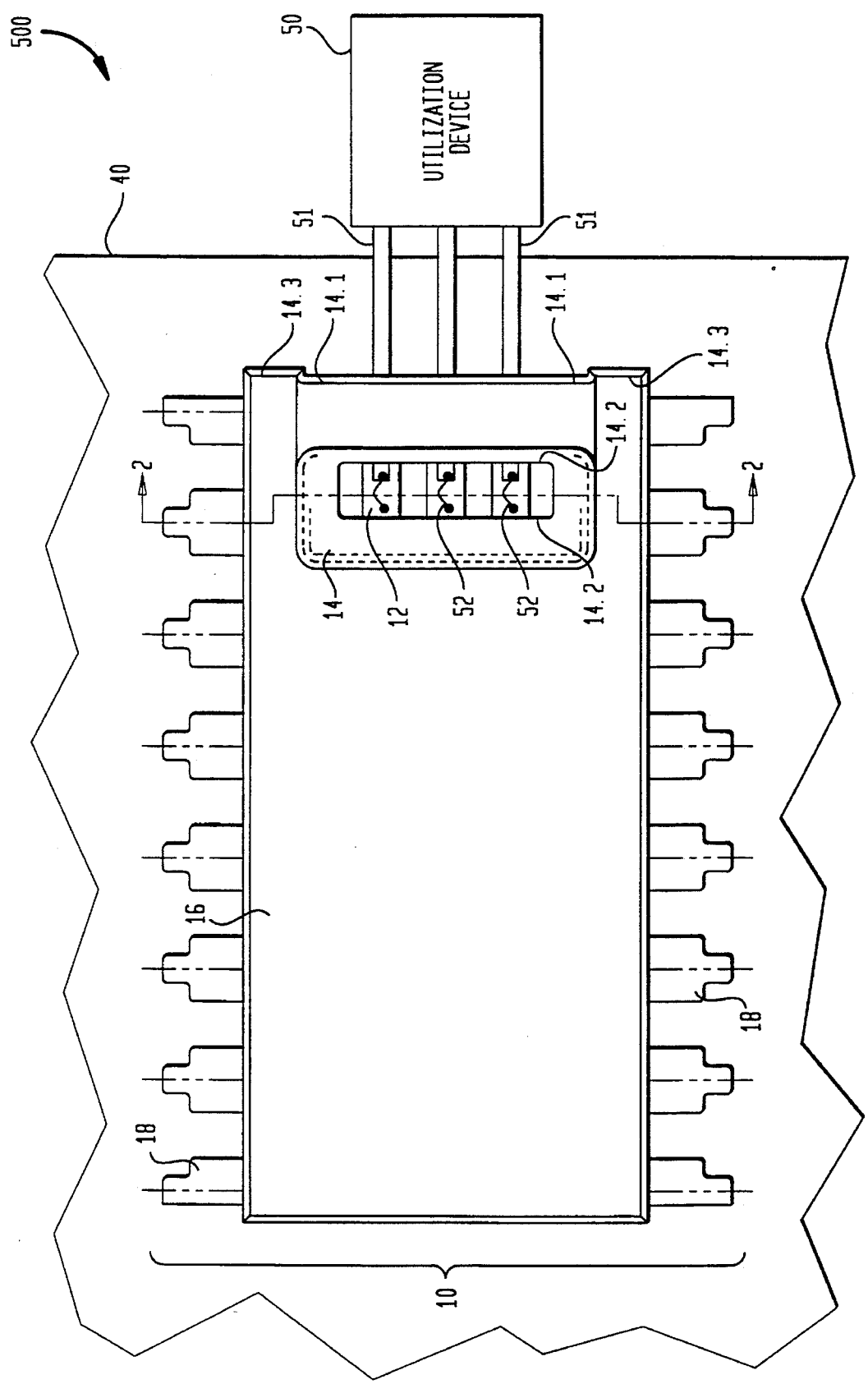
FIG. 5 is a top view diagram of an assembly including the overmolded DIP device depicted in FIG. 4, in accordance with yet another specific embodiment of the invention.

As shown in FIG. 5, a utilization device 50 is connected to the sites 12 via conductors 51 and the external wirebonds 52 to form an assembly 500. The utilization device 50 can be, for example, one or more electronic devices, optoelectronic devices, or electro-optic devices. The conductors 51 are typically made of an alloy, such as an iron-nickel-cobalt alloy ("Kovar"), coated with gold. Because the height of the overmolded package 10 is smaller at the areas where the edge 14.1 is located as compared with areas where the edge 14.3 is located, the conductors 51 fit nicely overlying the top surface of the package 10 at the areas of the package where the edges 14.1 are located, i.e., where the package 10 has a smaller height.

As mentioned above, various other material (and associated etchants) may be used to form protective layer 24. For example, silver may also be used. Also, the conductors 51 can be directly bonded, as by soldering or by welding, to the top surfaces of the contact layer 22 at the sites 12, whereby the external wirebonds 52 can be omitted. It is to be understood that although the invention has been described in detail with respect to specific embodiments, various modifications can be made without departing from the spirit and scope of the present invention.

What is claimed is:

1. A combination comprising:

an overmolded package comprising a molding material having a localized window therein;

a first electronic device located completely inside the overmolded package;

first and second pluralities of leadframe-fingers connected to the first electronic device, each of the leadframe fingers of the first plurality of leadframe fingers having an externally bondable site located within the localized window, whereby each of the sites is exposed at the localized window, the second plurality of leadframe fingers emerging from the molding material of the overmolded package at separate localized locations of the overmolded package that are removed from the localized window, and the molding material completely surrounding the leadframe fingers of the second plurality at these localized locations;

contact material covering said plurality of externally bondable sites; and removable protective material disposed to cover said contact material.

2. The combination of claim 1 in which the removable protective layer comprises copper.

3. The combination of claim 1 in which the contact material comprises gold.

4. The combination of claim 3 in which the removable protective layer comprises copper.

5. The combination of claim 1 in which the leadframe fingers comprise copper plated with nickel.

6. The combination of claim 5 in which the removable protective layer comprises copper.

7. The combination of claim 6 in which the contact material comprises gold.

8. An assembly comprising:

an overmolded package comprising a molding material having a localized window therein;

a first electronic device located completely inside the overmolded package;

first and second pluralities of leadframe-fingers connected to the first electronic device, each of the leadframe fingers of the first plurality of leadframe fingers having an externally bondable site located within the window, whereby each of the sites is exposed at the window, the second plurality of leadframe fingers emerging from the molding material of the overmolded package at separate localized locations of the overmolded package that are removed from the window, and the molding material completely surrounding the leadframe fingers of the second plurality at these localized locations;

contact material covering said plurality of externally bondable sites;

a second electronic device located externally to the overmolded package; and a plurality of conductors, equal in number to the first plurality, emanating from the second electronic device, each of the conductors of the third plurality being separately connected to the contact material of a separate one of the sites.

9. The assembly of claim 8 in which the first electronic device is an integrated circuit and the second electronic device is an opto-electronic device.

10. The assembly of claim 9 in which the opto-electronic device is light-emitting device controlled by electrical signals on at least one of the third plurality of conductors.

11. The assembly of claim 8 in which the second electronic device is an optical detector.

12. The assembly of claim 8 in which the contact material comprises gold.

13. The assembly of claim 12 in which the leadframe fingers comprise nickel-plated copper.

14. The assembly of claim 8 in which the leadframe fingers comprise nickel-plated copper.

15. The assembly of claim 8 further comprising a wiring board, the leadframe fingers of the second plurality being bonded to the wiring of the wiring board.

16. The assembly of claim 15 in which the contact material comprises gold.

17. The assembly of claim 16 in which the leadframe fingers comprise nickel-plated copper.

18. The assembly of claim 15 in which the leadframe fingers comprise nickel-plated copper.

19. The assembly of claim 8 in which the overmolded package has a height that is less in regions beneath each of the conductors than at the separate localized locations where the leadframe fingers of the second plurality emanate from the molding material.

* * * * *